United States Patent [19]

Wuu et al.

[11] Patent Number: 5,677,557
[45] Date of Patent: Oct. 14, 1997

[54] METHOD FOR FORMING BURIED PLUG CONTACTS ON SEMICONDUCTOR INTEGRATED CIRCUITS

[75] Inventors: Shou-Gwo Wuu; Chen-Jong Wang; Mong-Song Liang; Chung-Hui Su, all of Hsin-Chu, Taiwan

[73] Assignee: Taiwan Semiconductor Manufacturing Company, Ltd, Hsin-Chu, Taiwan

[21] Appl. No.: 742,129

[22] Filed: Oct. 31, 1996

Related U.S. Application Data

[62] Division of Ser. No. 496,019, Jun. 28, 1995, Pat. No. 5,607,879.

[51] Int. Cl.$^6$ .................... H01L 29/76; H01L 29/54; H01L 31/262; H01L 31/113
[52] U.S. Cl. .................... 257/382; 257/377; 257/385; 257/754; 257/756
[58] Field of Search .................... 257/382, 377, 257/385, 758, 763, 764, 754, 756

[56] References Cited

U.S. PATENT DOCUMENTS

| | | |
|---|---|---|
| 5,359,217 | 10/1994 | Murai . |
| 5,366,928 | 11/1994 | Wolters et al. . |
| 5,366,929 | 11/1994 | Cleeves et al. ............ 437/195 |
| 5,371,041 | 12/1994 | Liou et al. ............ 437/192 |
| 5,374,591 | 12/1994 | Hasegawa et al. ............ 437/187 |
| 5,595,928 | 1/1997 | Lu et al. . |

*Primary Examiner*—Mahshid D. Saadat
*Assistant Examiner*—S. V. Clark
*Attorney, Agent, or Firm*—George O. Saile; Stephen B. Ackerman

[57] ABSTRACT

A method for fabricating buried metal plug structures for multi-polysilicon layer interconnects and for concurrently making metal plugs on semiconductor integrated circuits, such as DRAM and SRAM, was achieved. The method involved forming contact opening in an insulating layer over opening in a patterned polysilicon layer. The opening in the polysilicon layer aligned over source/drain contact areas on the substrate and providing a means for forming self-aligned contact openings. Buried metal plugs in the contact openings form interconnects between the polysilicon layer and the source/drains. And, by merging the process steps, concurrently forming metal plug interconnects for contacts to semiconductor devices and first level metal. The process is applicable to the formation of bit line contacts on DRAM and SRAM circuits and simultaneously form the peripheral contact on the chip.

3 Claims, 6 Drawing Sheets

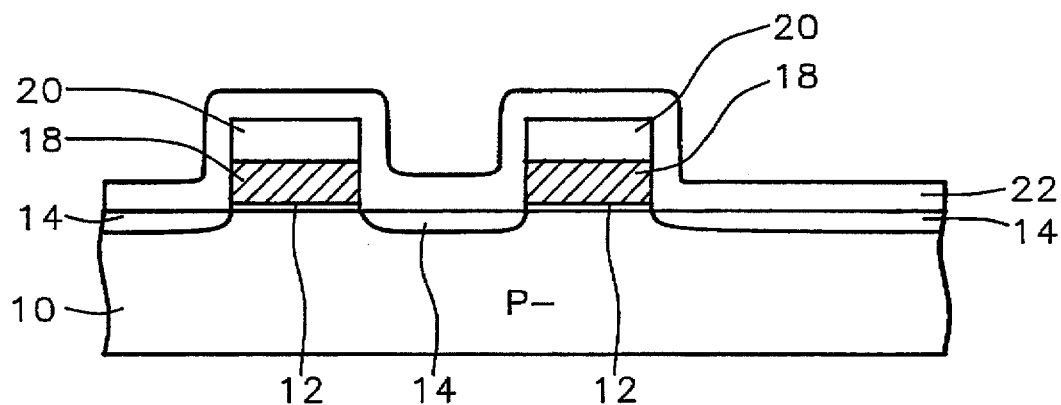
FIG. 1 - Prior Art
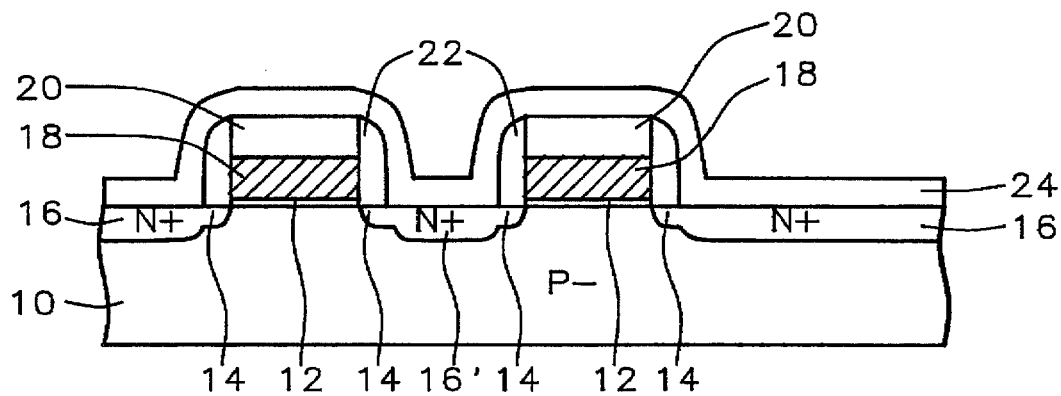
FIG. 2 - Prior Art
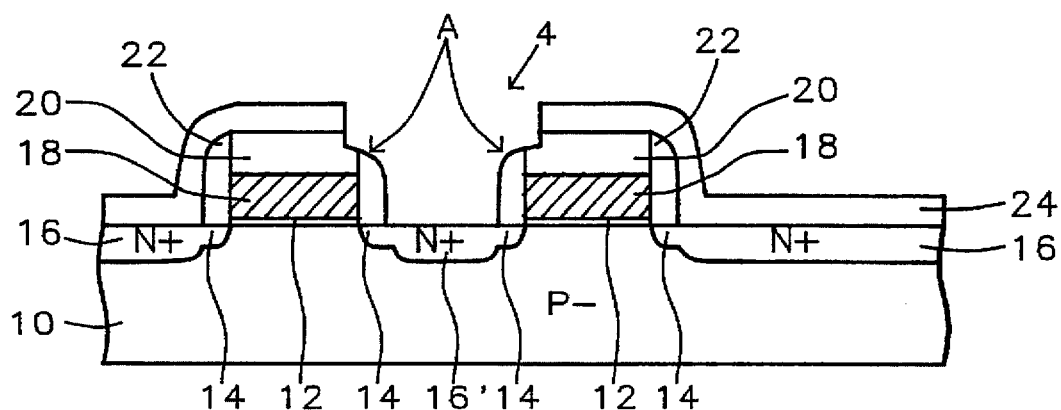
FIG. 3 - Prior Art

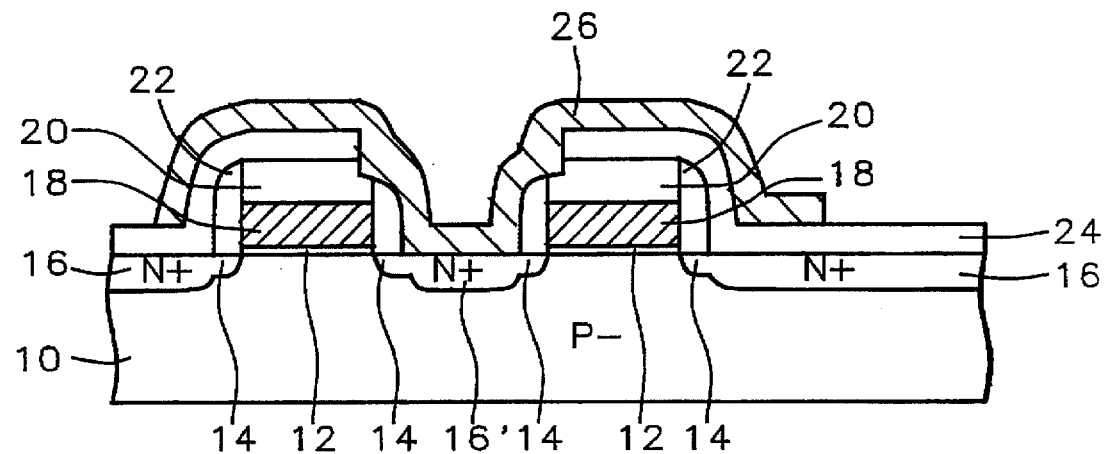
FIG. 4 — Prior Art
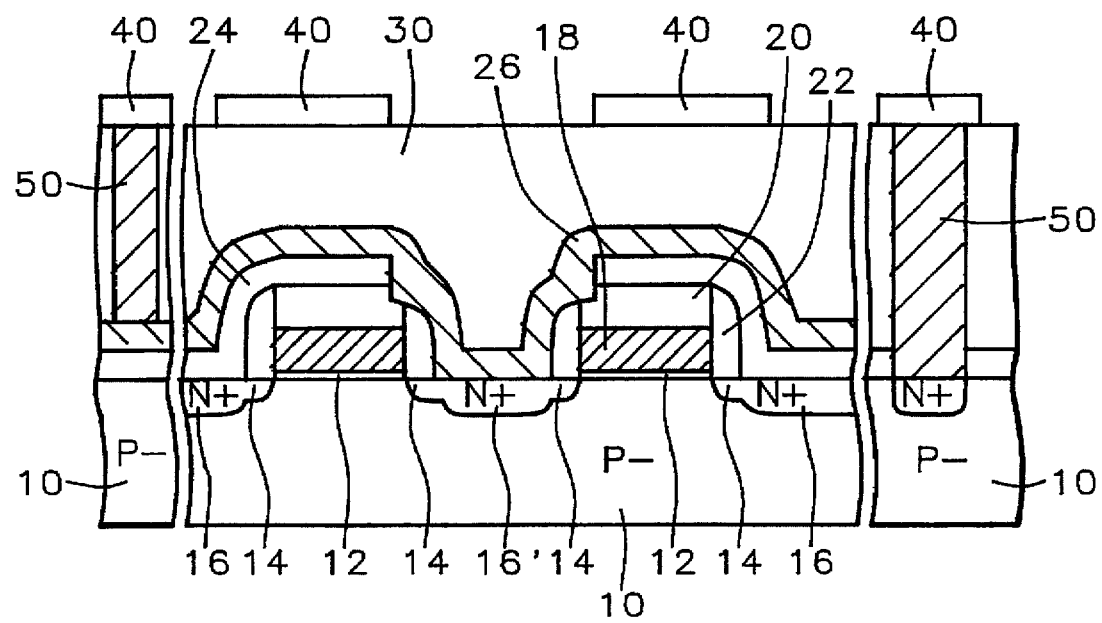
FIG. 5 — Prior Art

METHOD FOR FORMING BURIED PLUG CONTACTS ON SEMICONDUCTOR INTEGRATED CIRCUITS

This is a Division of U.S. patent application Ser. No. 08/496,019 dated Jun. 28, 1995 now U.S. Pat. No. 5,607,879.

BACKGROUND OF THE INVENTION

(1) Field of the Invention

The present invention relates to a method of fabricating integrated circuits on semiconductor substrates, and more particularly to a method for making buried metal plug contacts that interconnect polysilicon layers to device contacts and concurrently making metal plug contacts between the metal wiring and devices on semiconductor substrates.

(2) Description of the Prior Art

Advances in semiconductor process technologies have significantly reduced device size and increased the device packing density on semiconductor substrates. This has resulted in features sizes less than 0.5 micrometers, and aspect ratios (height to width) for contact openings and for spacings between conducting lines that exceed values greater than 1.0. This rough surface topography makes it difficult to form reliable self-aligned contact to devices contact areas on the substrate and also to form reliable electrical interconnections.

To better understand the problem, schematic cross sectional views are shown in FIGS. 1 through 4 for making a conventional prior art self-aligned contacts to a source/drain areas of a field effect transistors (FETs), as are commonly used on static random access memory (SRAM) and dynamic random access memory (DRAM) chips and the likes. Only a portion of the integrated circuit is shown in the Figs. to simplify the discussion. The process is described for forming a self-aligned contact to a common source/drain area between two FETs.

Starting with FIG. 1, the process begins by providing a semiconductor substrate 10 with device areas on which is formed a thin gate 12. Not shown in the Figs. to simplify the drawing, is a thicker field oxide areas that surrounds and electrically isolates the device areas. The field oxide areas are formed, for example, using the LOCal Oxidation of Silicon (LOCOS) method. A doped first polysilicon layer 18 having a cap oxide layer 20 on the surface is deposited and patterned by conventional photolithographic means and anisotropic plasma etching to form gate electrodes 18 in the device areas and electrically conducting lines elsewhere on the field oxide areas. Also shown in FIG. 1, lightly doped source/drain areas 16 are usually formed in the substrate 10 adjacent to the gate electrodes 18 by ion implantation. A conformal insulating layer 22, such as a silicon oxide, is then deposited on the substrate and etched back to form sidewall spacer 22 on the sides of the gate electrodes, as shown in FIG. 2. A second ion implantation is then used to form a higher dopant concentration in the substrate adjacent to the sidewalls 22 forming the source/drain contacts 16 and 16'.

Now as shown in FIG. 3, a first insulating layer 24, such as a silicon oxide, is deposited on the cap oxide 20/gate electrodes 18 structures and also over the source/drain areas 16 and 16' of the FETs. Self-aligned contact openings are etched in layer 24 to the source/drain areas of the FETs using a conventional photoresist mask and anisotropic etching. One such contact opening 4 is shown in FIG. 3 exposing the source/drain area 16'. The opening 4 also extends over the gate electrodes 18 and is etched down to the cap oxide layer 20. Unfortunately, when the contact opening 4 is etched, it is necessary to over-etch to insure that the surface of the source/drain areas are exposed in the multitude of openings that are formed on semiconductor substrate, such as in the many cell areas on DRAM and SRAM devices. Because of variations in the thickness of layer 24 across the substrate (nonuniform), the non selectivity of the etching to layer 20, and the difficulty in controlling the over-etch, it is difficult to reliably form the self-aligned contacts without exposing the gate electrode 18 and causing shorts, for example, as might occur in regions labeled A in FIG. 3. Although not depicted in the Figs. the problem of over-etching is further complicated when the spacing between the electrodes 18 is less than twice the thickness of the conformal layer 24, since the layer 24 then partially fills in the high aspect ratio spacing forming a more planar surface. This results in a thicker oxide layer 24 in the source/drain area 16', and it becomes necessary to further increase the over etch in layer 24 to form the contact opening 4, and shorts are even more likely to occur.

Continuing with the process, as shown in FIG. 4, a conductivity doped second polysilicon layer 26 or alternatively a polycide layer (a polysilicon layer having a metal silicide on its surface) is deposited and patterned to form the next level of interconnecting metallurgy. However, because of the severe topography in the underlying self-aligned contact opening, it is difficult to deposit layer 30 with good step coverage. Furthermore, it is difficult to pattern layer 26 using anisotropic etching without leaving residue from layer 26 on the sidewall between the closely spaced polysilicon lines, which can result in intralevel shorts.

The FET structures having these conventionally formed self-aligned contact are then completed to the first level metal interconnects, as shown in FIG. 5. A planar insulating layer 30, composed, for example, of borophosphosilicate glass (BPSG) is deposited over the patterned second polysilicon layer 26. Contact openings are etched, for example, in the peripheral areas of the chip to contact the polysilicon layers and to contact the substrate surface. The contact openings are then filled with a metal barrier plug 50, such as by chemical vapor deposition (CVD) using a tungsten hexafluoride ($WF_6$) gas. A first metal layer 40 is then patterned to complete the integrated circuit up to the first level of metal wiring.

Although metal plugs have been proposed and used extensively for making contacts to the substrate and to the inter polysilicon layers they do not address the problem of making improved self-aligned contacts to the source/drain areas of FETs. For example, T. Hasegawa, U.S. Pat. No. 5,374,591 describes a method of forming tungsten buried plugs in an opening in an insulator to the surface of the substrate that do not have voids, while F. Liou, U.S. Pat. No. 5,371,041 teaches a method of making contact openings with sidewall spaces that taper the sidewall and thereby fills the contact opening with an electrically conductive material that is also void free. Still another invention by J. Cleeves, U.S. Pat. No. 5,366,929 describes a method for forming a metal plug using a seed layer on the contact opening sidewall and selectively growing a conducting material thereon.

However, there is still a strong need in the semiconductor industry for forming device structures having interconnecting metallurgies that conserve processing steps, reduce the rough surface topography over the semiconductor device and provides a metal plug technology that improves the electrical contact between the inter-polysilicon layers and the source/drain contacts.

SUMMARY OF THE INVENTION

In view of the above mentioned short comings of the conventional self-aligned contact it is a principle object of this invention to provide a process for forming, self-aligned metal plug structures between the polysilicon layer and the FET source/drain contact areas, and also with the same processing steps (concurrently) form metal plugs that interconnect the polysilicon layers and other device contact areas on the substrate to the first metal level.

It is another object of this invention to provide the above structure while reducing the topography under the second polysilicon layer, and thereby providing a surface for improving the edge coverage and etching characteristics during the deposition and patterning of the second polysilicon layer.

It is still another object of this invention to form the self-aligned metal plug contacts by providing an openings in the second polysilicon layer over the source/drain contact areas that functions as a self-aligning etch mask for etching the contact openings to the source/drain contact areas.

And it is still another object by a second embodiment of this invention to form undoped polysilicon sidewall spaces on the FET gate electrodes, thereby increasing the alignment tolerance for forming the self-aligned metal plug on the source/drain contact.

The method for forming the metal plug structure starts by providing a semiconductor substrate, usually consisting of a lightly doped single crystal silicon substrate having device areas on the substrate surface, and surrounded by electrically isolating field oxide (FOX) areas. Typically the N-channel or P-channel field effect transistors having gate electrodes and interconnecting word lines are formed from a first polysilicon layer in the device areas. Lightly doped source/drain areas are then formed adjacent to the gate electrodes, and sidewall spacers are formed. The sidewall spacers are formed by depositing a sidewall material layer and blanket etching back anisotropically (directional etching). Typically the sidewall layer is composed of an insulator, such as silicon oxide (SiO2), but in the second embodiment of this invention an undoped polysilicon layer is also used. After forming the spacers, the remaining exposed source/drain areas are heavily doped, for example by ion implantation, to form the source/drain contact areas, and thereby complete the FETs.

The improved buried metal plug structure of this invention is formed next by depositing a first insulating layer, such as silicon oxide, on the FET devices and elsewhere on the substrate. A second polysilicon layer is then deposited, for example, by low pressure CVD (LPCVD) and is heavily doped to provide good electrical conductivity. Alternatively, an undoped polysilicon layer having a silicide formed on the surface (polycide) can also be used. A key feature of this invention and unlike the conventional method, the self-aligned contact (SAC) openings are not etched in the first insulating layer prior to depositing the second polysilicon layer. And a second key feature is that the cap oxide on the FET gate electrode, commonly used in the conventional SAC technology, is omitted in this invention. These two key features provide a much improved surface topography that minimize the edge coverage problem when the second polysilicon layer is deposited and also minimize the etch residue problem when the polysilicon layer is patterned by anisotropic etching.

The second polysilicon layer is now patterned, using conventional photolithographic means and anisotropic plasma etching. During the patterning, openings are also formed in the second polysilicon layer, that are aligned over the source/drain contact areas that require a self-aligned contact, such as might be used for the bit line contacts on a DRAM or SRAM chip. As will be seen shortly, the openings in the polysilicon layer provide a means for making contacts to the source/drain that are self-aligned to the opening in the patterned second polysilicon layer. A second insulating layer is now deposited on the patterned second polysilicon layer and elsewhere on the first insulating layer. The second insulating layer is preferably composed of a low flow temperature glass that is annealed to provide an essentially planar surface. Photolithographic techniques and anisotropic plasma etching are used to form contact openings in the second insulating layer to various parts of the underlying device structure. The openings in the photoresist mask that are to provide metal plug contacts between the source/drain contact areas and the second polysilicon are aligned over and are larger in width (diameter) than the openings in the second polysilicon layer. The second insulating layer is then anisotropically and selectively etched in the photoresist openings to the second polysilicon layer surface. The plasma etching conditions and gas mixture are selected to provide a high etch rate selectivity between silicon oxide and polysilicon. For example, the etch rate ratio of silicon oxide to polysilicon would typically be equal to or greater than about 30 to 1.0. Thereafter, and continuing with the same etching, the first insulating layer exposed in the openings of the second polysilicon layer is etched to the source/drain contact areas forming contact openings that are self-aligned to the edge of the openings in the second polysilicon layer. The openings having essentially vertical sidewalls. Concurrently, and using the same photoresist mask, contacts opening are also etched to other parts of the device structure. For example, contact openings are also etched in the second insulating layer to other portions of the patterned second polysilicon layer, the polysilicon layer functioning as an etch stop layer. And still other contact openings are etched in both the second and the first insulating layers to device contacts on the substrate in areas free of the patterned second polysilicon layer, such as would be required for making contacts to the peripheral circuits on a DRAM or SRAM chip. The photoresist mask is then removed by conventional means and a plug metal is deposited, such as tungsten (W), over the second insulating layer and in the contact openings. The metal plug layer is then etched back to form metal plugs that are co-planar with the surface of the second insulating layer. The metal plug structure is then completed up to first level interconnect wiring by depositing and patterning a first metal layer, such as aluminium or an aluminium copper alloy As is clearly seen, a number of advantages are achieved by the current invention over the conventional SAC method. The rough topography of the surface is reduced for patterning the second polysilicon layer. The SAC photoresist mask level in eliminated. The process for making the metal plug contact between the second polysilicon layer (e.g. bit line) and the source/drain contact area is merged with the metal plug process for making the first metal contacts to the peripheral circuit elements on the chip, thereby saving manufacturing process steps.

BRIEF DESCRIPTION OF THE DRAWINGS

The objects and other advantages of the invention are best understood with reference to the preferred embodiments when read in conjunction with the following drawings.

FIGS. 1 through 5 show schematic cross sectional views of a prior art process sequence for making a self-aligned contacts to a common source/drain contact area of two field effect transistors, as is commonly used on DRAM or SRAM memory cells. Also shown are metal plug contacts that are commonly made to the peripheral circuits on the chip.

DESCRIPTION OF THE PREFERRED EMBODIMENTS

The present invention relates to the formation of metal plugs for interconnecting a patterned second polysilicon layer, such as bit lines on a DRAM cell, with source/drain areas of the FET on the substrate, and for merging (concurrently forming) the metal plug contacts for the bit lines and substrate for the first level metal layer. Although this buried metal plug method is directed to the use on DRAM and SRAM devices, it should be well understood by those skilled in the art that the method for merging the metal plugs can equally apply to other semiconductor integrated circuits requiring a buried metal plug. Also the method is described for N-channel FETs, such as used in the cell area of a DRAM or SRAM device, but the method equally applies to P-channel FETs, and in general to CMOS circuits that utilize both N and P-channel FETs.

Referring now to FIGS. 6 through 9, the first embodiment of this invention is described in detail for the formation of the buried plug contact to a common source/drain contact area of two adjacent N-channel FETs, and concurrently forming the metal plugs for interconnecting the patterned polysilicon layer (e.g. bit lines) and other peripheral substrate contacts to the first level metal level.

Figure 6:
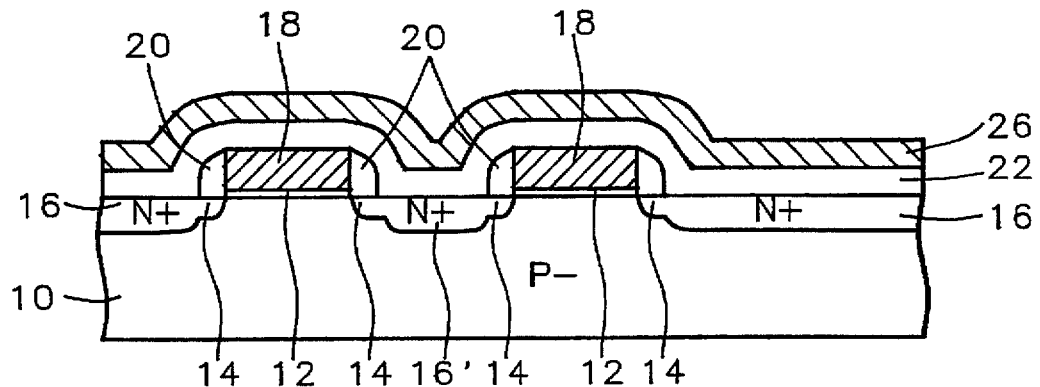
FIGS. 6 through 9 show schematic cross sectional views of the buried metal plug contact formed by the method of the first embodiment of this invention. The concurrently formed metal plugs in the peripheral areas of the chip are also depicted in FIGS. 8 and 9.

Referring first to FIGS. 6, a schematic cross sectional view is shown of a portion of a device area on a P⁻ doped silicon substrate 10 having a partially completed device structure. Field oxide areas surrounding and electrically isolating the device area are not shown to simplify the drawing and discussion. In the device areas is grown a gate oxide (SiO2) 12. A first polysilicon layer 18 is then deposited, for example, by low pressure chemical vapor deposition (LPCVD) using a reactant gas mixture containing silane ($SiH_4$). The first polysilicon layer is typically doped with an N-type dopant, such as arsenic (As) either by ion implantation or by in situ doping during the polysilicon deposition. The concentration of the arsenic after doping is typically between about 1.0 E 18 to 1.0 E 21 atoms/cm³, and the thickness of layer 18 is preferably between about 1000 to 3500 Angstroms.

The first polysilicon layer 18 is then patterned using conventional photolithographic techniques and directional plasma etching to form the FET gate electrodes 18, as shown in FIG. 6 and to form the interconnecting lines elsewhere on the substrate (not shown), such as the word lines on a DRAM or SRAM device. Typically in the more conventional self-aligned contact (SAC) process a cap oxide is formed on the first polysilicon 18 prior patterning the layer. However, in the present invention the cap oxide is not required thereby minimizes the topography of the substrate surface. After patterning layer 18, lightly doped source/drain areas 14 are formed in the substrate 10 adjacent to the gate electrodes 18, by ion implantation of an N-type dopant, such as arsenic ($As^{75}$).

Still referring to FIG. 6, sidewall spacers 20 are formed on the sidewalls of the gate electrodes 18. These sidewall spacers are formed by depositing a conformal sidewall material layer composed of silicon oxide and having a thickness of between 1400 to 2800 Angstroms is etched back using an anisotropic plasma etch. For example, the silicon oxide layer can be deposited in a medium temperature of between about 650° to 750° C. using a LPCVD and a reactant gas mixture containing, for example, tetraethosiloxane (TEOS). The anisotropic etch back can, for example, be carried out in a reactive ion etcher using a selective etch gas mixture containing carbon tetrafluoride ($CF_4$) and hydrogen ($H_2$) or a mixture containing trifluoro-methane ($CHF_3$). In a second embodiment of this invention, described later, an alternative method of making the metal plug contacts is described in which an undoped polysilicon sidewall spacer is used to further improve the buried plug process.

After forming the sidewall spacers 20 a second ion implantation is used to form the source/drain contact areas 16. Typically the heavily doped source/drain contact areas are achieved by implanting a dopant such as arsenic or phosphorous. The preferred implant dopant is arsenic (As) and is implanted having an implant dose of between about 2.0 E 15 to 6.0 E 15 atoms/cm² and an implant energy of between about 35 to 50 KeV. This completes the formation of the N-channel FETs, and the metal plug structure is now formed.

As further illustrated in FIG. 6, a blanket first insulating layer 22, also commonly referred to as a interpolysilicon oxide (IPO), is deposited on the FET structures and elsewhere on the substrate surface. The preferred deposition is by LPCVD using, for example, TEOS, as describe earlier for depositing the sidewall spacer oxide layer. The preferred thickness of layer 22 is between about 800 to 3000 Angstroms. Typically in the conventional SAC process of the prior art, the SAC contact openings would be etched in layer 22 to expose the surface of the source/drain contact area 16' to which a patterned second polysilicon layer makes contact. However, in the present invention the contact openings are not, at this time, etched open. As shown in the FIG. 6 the second polysilicon layer 26 is deposited over the first insulating layer 22. The layer 26 is deposited by a low pressure chemical vapor deposition, for example, using a reactant gas mixture containing silane ($SiH_4$), and doped with an N-type dopant, such as phosphorus (P) either by ion implantation of during the polysilicon deposition by adding, for example, phosphine ($PH_3$) to the CVD reactant gas. The preferred dopant concentration in the polysilicon layer 26 is between about 1.0 E 18 to 1.0 E 21 atoms/cm³. The preferred thickness of layer 26 is between about 1000 to 3000 Angstroms. Alternatively, the layer 26 can be composed of an undoped polysilicon layer having a silicide formed on the surface, commonly referred to as a polycide. The preferred silicide is a refractory metal silicide, such as tungsten silicide ($WSi_2$) or titanium silicide ($TiSi_2$) and can be deposited by a variety of methods, such as by direct metallurgical reaction of a metal film on the polysilicon layer or by deposition, such as by co-evaporation, co-sputtering and for a tungsten silicide, CVD can also be deposited by the decomposition of tungsten hexafluoride ($WF_6$). The preferred thickness of the silicide on the polysilicon layer 26 is between about 1000 to 2000 Angstroms.

Figure 7:
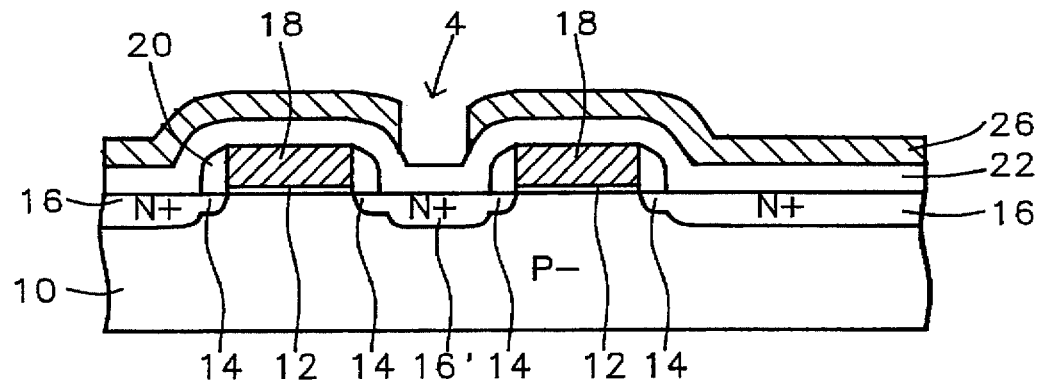

As shown in FIG. 7, the second polysilicon layer 26 is now patterned using conventional photolithographic techniques and an anisotropic plasma etch, for example, the etching can be accomplished in a reactive ion etcher (RIE) using a etch gas mixture containing chlorine (Cl2). The patterning of layer 26 also includes the formation of an opening 4 in the second polysilicon layer 26 aligned over the source/drain contact 16', and is an important feature of the invention. As will soon be clear, the opening 4 is used to form a contact opening in the first insulating layer 22 to the source/drain contact area 16' that is self-aligned to the perimeter of the opening 4 in layer 26.

Figure 8:
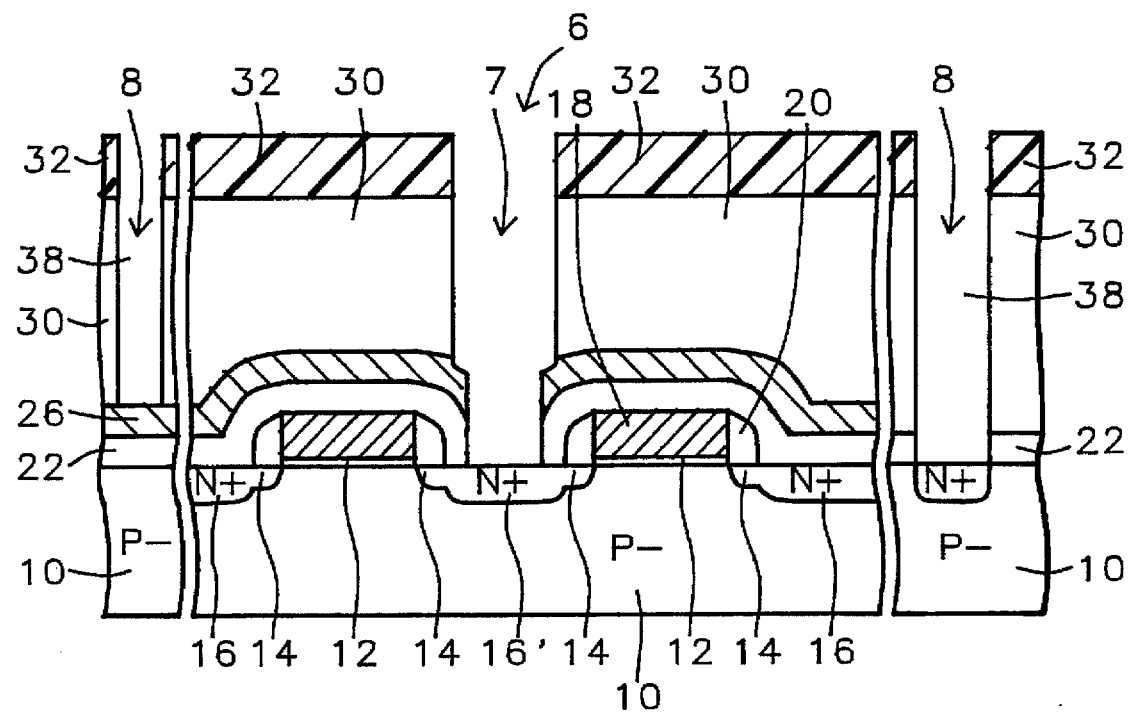

As shown in FIG. 8, a second insulating layer 30 is deposited over the patterned polysilicon layer 26 and elsewhere on the exposed surface of the first insulating layer 22. Also shown in FIG. 8, are other portions of the integrated circuit chip, such as on the periphery of the chip, where other contacts are required. Preferably the insulating layer 30 is composed of a low flow temperature glass that provide, upon annealing, a leveling effect for planarizing the surface layer 30. For example, layer 30 can be deposited by low pressure chemical vapor deposition (LPCVD) using a reactant gas, such as silane ($SiH_4$) and adding phosphorous and boron dopants, such as phosphine ($PH_3$) and diborane(6) ($B_2H_6$) to form a borophosphosilicate glass (BPSG). The glass is then annealed for about between 25 to 40 minutes at a temperature of between about 850° to 900° C. to level the glass layer 30.

Still referring to FIG. 8, a photoresist layer 32 is coated on layer 30 and patterned by lithographic means to form openings 6 aligned over the openings 4 in the second polysilicon layer 26. Additional openings, also labeled 6 are formed elsewhere in the photoresist layer 32 over portions of the device circuit that also require contacts. For example, openings 6 are also formed over the patterned second polysilicon layer 26 in the peripheral areas of the chip, as depicted to the left in FIG. 8, and are also formed to the substrate 10, as depicted to the right in FIG. 8.

Anisotropic plasma etching is then used to etch the BPSG layer 30 exposed in the photoresist mask openings 6. The preferred etching is carried out in a reactive ion etcher (RIE) using an etch gas mixture having a high etch rate selectivity of silicon oxide to silicon. For example, the etching can be achieved using a gas mixture containing a carbon tetrafluoride ($CF_4$) and hydrogen ($H_2$) or alternatively, in a gas mixture containing trifluoromethane ($CHF_3$). The preferred etch rate ratio of silicon oxide to silicon being greater than about 30 to 1.

As shown in FIG. 8, the buried contact openings 7 are etched in second insulating layer 30 (BPSG) to the surface of the second polysilicon layer 26, and then continuing the etching the first insulating layer 22, in the openings 4 of the first polysilicon layer 26 is etched to the source/drain contact area 16'. This completes the contact openings in layer 22, as shown in FIG. 8, that are self-aligned to the polysilicon opening 4 having essentially vertical sidewalls. An important aspect of the invention is the masking effect of the polysilicon to the silicon oxide etch. For example, if layer 22 is about 2100 Angstroms thick then the amount of polysilicon etch from layer 26 is a mere 70.0 Angstroms. Another important feature is that the aligning tolerance for openings 6 in photoresist layer 32 can be relaxed since the contact openings in the first insulating layer are self-aligned to the openings 4 in the polysilicon layer 26. Concurrent, the contact openings 8, such as at the peripheral areas of the chip, are etched to the polysilicon layer 26 that provides an excellent etch stop for those contacts. The contact openings 8 etched to the substrate 10, also depicted in FIG. 8, are also very selectively etched because the substrate is composed of a single crystal silicon.

The photoresist layer 32 is then removed by conventional means, such as plasma ashing in an oxygen ambient, and metal plugs are formed next in the contact openings.

Figure 9:
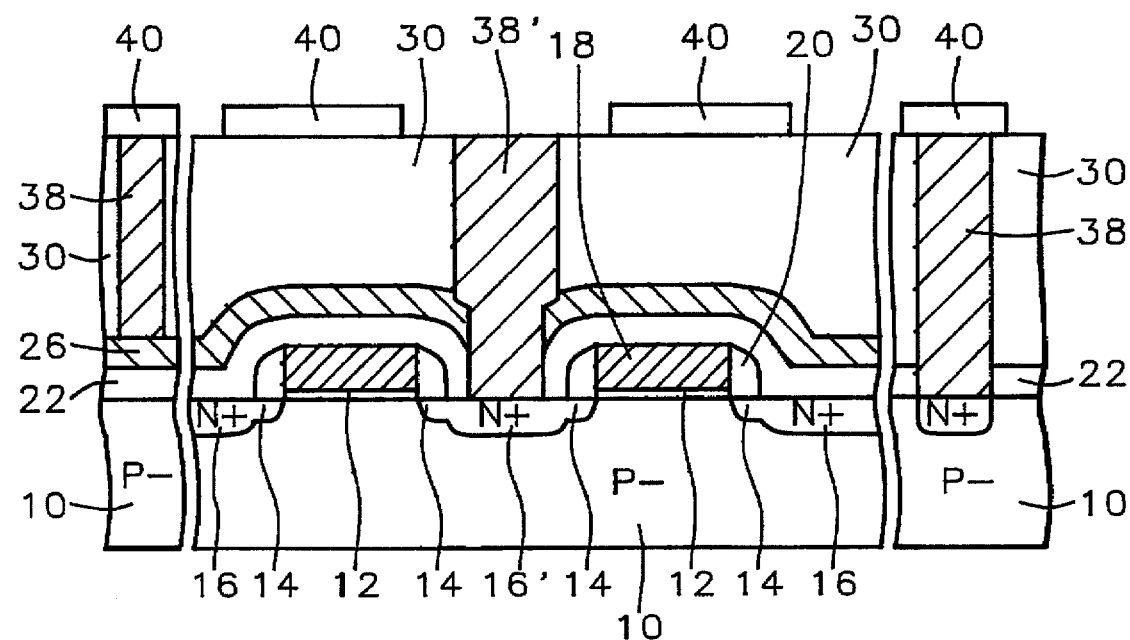

Referring now to FIG. 9, buried metal plugs 38' are formed in the contact openings 7 to electrically connect the second polysilicon layer 26 to the source/drain contact areas 16', while concurrently metal plugs 38 are formed in the contact openings 8 to electrically connect the other device areas on the chip to a patterned first level metal 40. The metal plugs 38 and 38' are formed by depositing a conformal plug metal layer 38 on the second insulating layer and in the contact openings 7 an 8 and then blanket etching back the metal to the surface of the second insulating layer 30. The plug metal layer 38 is preferably composed of tungsten (W) and is typically deposited by CVD using, for example, by the decomposition of tungsten hexafluoride ($WF_6$). The preferred thickness of layer 38 being sufficiently thick to fill the submicrometer contact openings 7 and 8. For example, the preferred thickness of layer 38 is between about 5000 to 8000 Angstroms.

A first level metal layer is then deposited and patterned by conventional photolithographic techniques and plasma etching to provide the first level metal interconnects to the metal plugs 18, while leaving exposed the buried metal plugs 18' that interconnect the polysilicon layer 26 to the source/drain contact areas 16', as would be required, for example, for the bit lines on DRAM ans SRAM devices. The first metal layer is preferably composed of aluminium (Al) or an aluminium copper (Al/Cu) alloy and deposited by physical vapor deposition (PVD) and patterned by plasma etching.

Referring now more specifically to FIGS. 10 through 13, a second embodiment of the invention is described which utilizes a modified sidewall spacer structure, but is in other respects similar to the first embodiment. Therefore, the numerals used in the Figs. of the first embodiment are also used to identify similar structures in the second embodiment. And only the process steps that differs from the first embodiment are discussed in details in the second embodiment.

Figure 10:
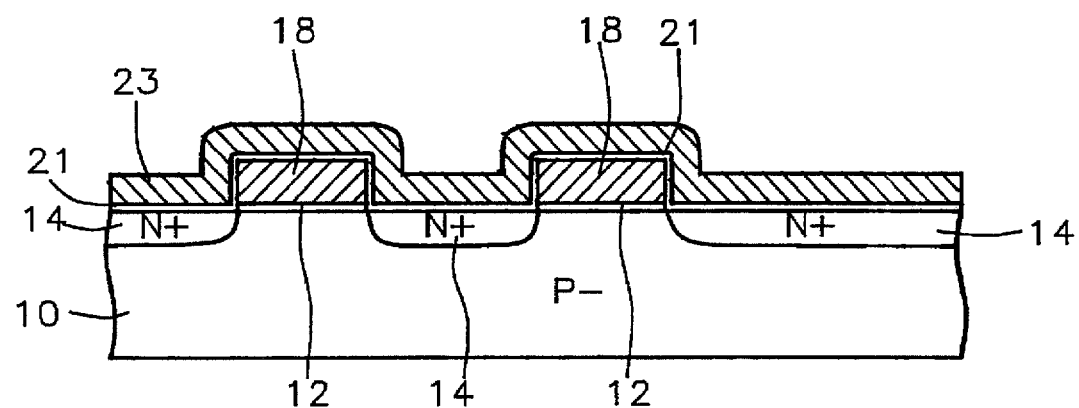
FIGS. 10 through 13 show schematic cross sectional views of the buried metal plug contact formed by the method of the second embodiment of this invention using an undoped polysilicon sidewall spacer. The concurrently formed metal plugs in the peripheral areas are also depicted in 12 and 13.

Referring now to FIG. 10, a silicon substrate 10 is provided having gate oxides 12 and gate electrodes 18 formed in the device areas by conventional means, as is described in the first embodiment. The method now differs from the first embodiment by forming a sidewall material layer by depositing a relatively thin blanket silicon oxide layer 21 on the gate electrodes and elsewhere on the substrate, and then depositing a thicker undoped polysilicon. The silicon oxide layer 21 is preferably deposited by LPCVD, for example using TEOS, and is between about 400 to 800 Angstroms thick. The polysilicon layer 23 is preferably deposited also by LPCVD using for example, a reactant gas containing silane, and is between about 1000 to 2000 Angstroms thick. The polysilicon layer 23 is then anisotropically etched to the surface of the silicon oxide layer 21, thereby forming, on the sidewalls of the gate electrodes 18, sidewall spacers 23 from the undoped polysilicon layer 23 and further having the thin silicon oxide layer 21 there between. The preferred etch back of layer 23 is a high selective etch rate of polysilicon to silicon oxide, such as in a reactive ion etcher or high plasma density etcher using an etch gas containing chlorine ($Cl_2$).

Figure 11:
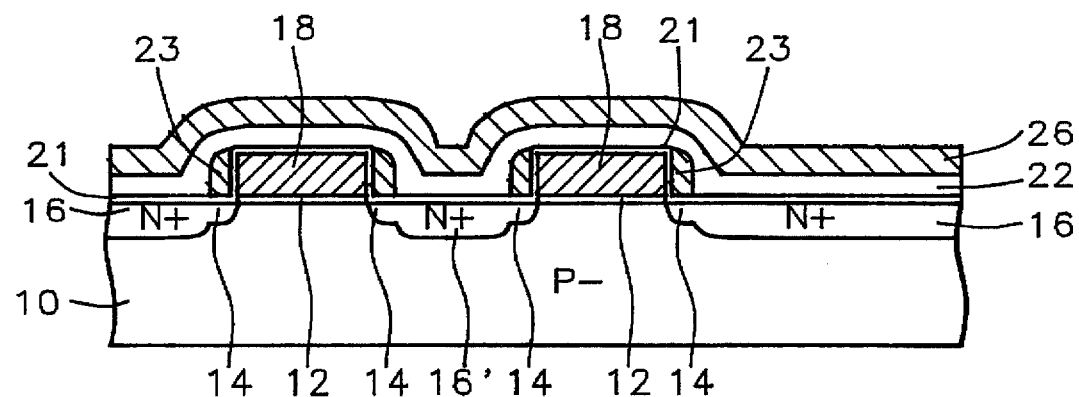
Figure 12:
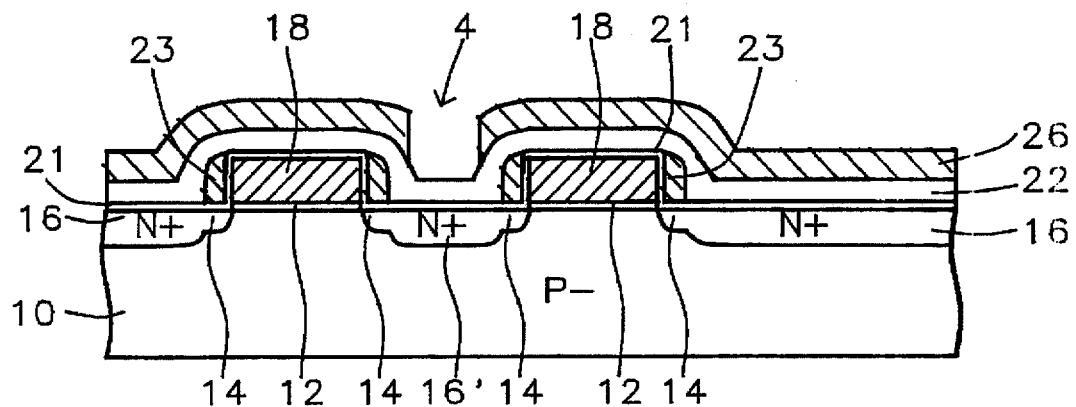

The buried metal plug process continues exactly as in the first embodiment, with one important exception. After depositing the first insulating layer 22 and the second polysilicon layer 26, by the method of the first embodiment, as also shown in FIG. 11, the alignment ground rules for etching the openings 4 in polysilicon layer 26 can be relaxed (greater latitude in alignment) since the polysilicon sidewall spacers 23 provide an etch stop layer when later etching the contact openings 7. One such opening 4 in second polysilicon layer 26 aligned over the source/drain contact areas 16' is shown in FIG. 12. Also shown are the polysilicon sidewall spacers 23 under the opening 4.

Figure 13:
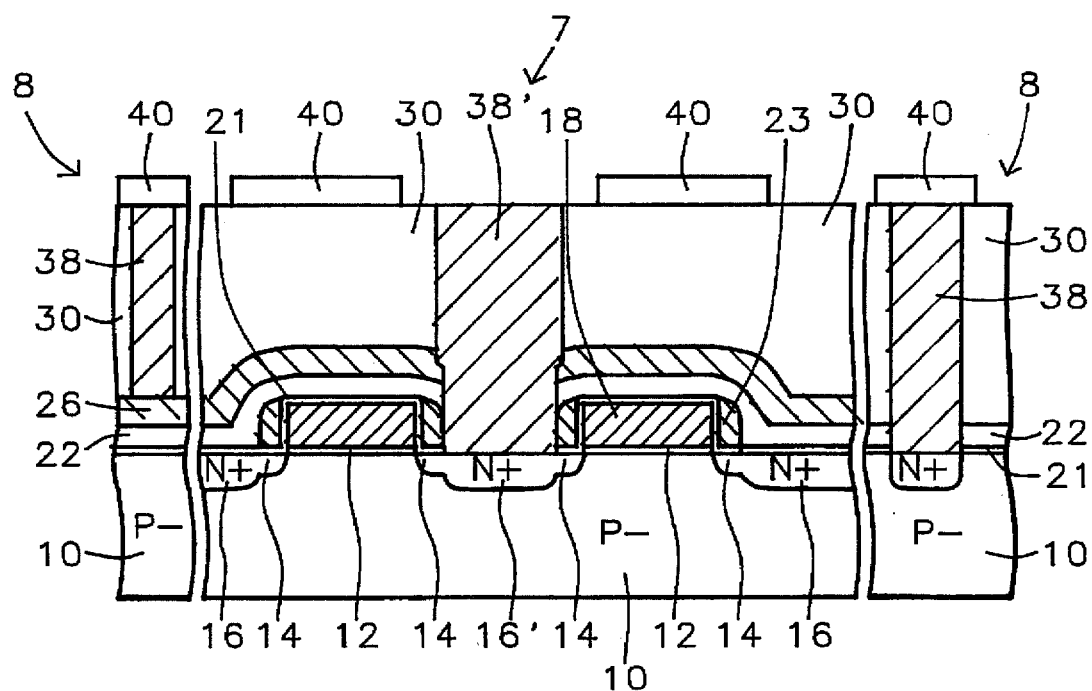

Now as shown in FIG. 13, and according to the process of the first embodiment, a second insulating layer 30 composed of BPSG is deposited and the contact openings 7 are etched to the source/drain contact areas 16' through the self-aligning opening 4 in layer 26, and concurrently, the contact opening 8 are etched to other areas (e.g. peripheral areas on the chip) as in the first embodiment. The tungsten plugs 38' and 38 are formed in the contact openings 7 and 8 respectively and a first metal, such as aluminium is patterned to complete the buried plug structure up to the first level interconnects.

While the invention has been particularly shown and described with reference to the preferred embodiments thereof, it will be understood by those skilled in the art that various changes in form and details may be made without departing from the spirit and scope of the invention.

What is claimed is:

1. A buried metal plug structures on a semiconductor substrate for making electrical interconnections, comprising:

a semiconductor substrate having device areas and field oxide areas and further having field effect transistor devices having gate electrodes composed of a patterned first polysilicon layer and sidewall spacer formed from a sidewall material layer and source/drain contact areas in said device areas;

a blanket first insulating layer on said semiconductor devices and elsewhere on said substrate;

a patterned second polysilicon layer on said first insulating layer having openings aligned over said source/drain areas and said patterned second polysilicon layer providing electrically conducting portions elsewhere on said first insulating layer;

a second insulating layer on said patterned second polysilicon layer, and elsewhere on said first insulating layer, said second insulating layer being a low flow temperature glass that provides a planar surface;

said second insulating layer having contact openings aligned over and larger in width than said openings in said second polysilicon layer; and furthermore said first insulating layer having opening within said openings of said second polysilicon layer extending to said source/drain contact areas, said contact openings in said first insulating layer being self-aligned to the edge of said second polysilicon layer openings and having vertical sidewalls; and furthermore said second insulating layer having other contact openings elsewhere over and extend to the surface of said patterned second polysilicon layer, and said second and first insulating layers having contact openings to the surface of said substrate in regions free of said second polysilicon layer;

said contact openings having metal plugs the surface of which are coplanar with the surface of said second insulating layer;

a patterned first metal layer on said second insulating layer providing electrical interconnects to said substrate and said patterned second polysilicon layer by contacting said metal plugs while said self-aligned metal plug form interconnects between said patterned second polysilicon layer and said source/drain contact areas of said field effect transistors devices, thereby providing said completed buried metal plug structure.

2. The buried plug structure of claim 1, wherein said sidewall material layer is composed of silicon oxides having a thickness of between about 1400 to 2800 Angstroms.

3. The buried plug structure of claim 1, wherein said sidewall material layer is composed of a silicon oxide having a thickness of between about 400 to 800 Angstroms and an upper layer composed of undoped polysilicon having a thickness of between about 1000 to 2000 Angstroms.

* * * * *